US012633720B2

(12) United States Patent (10) Patent No.: US 12,633,720 B2
Tomiyasu et al. (45) Date of Patent: May 19, 2026

(54) SUBMOUNT, LIGHT EMITTING DEVICE, AND OPTICAL MODULE

(71) Applicant: FURUKAWA ELECTRIC CO., LTD., Tokyo (JP)

(72) Inventors: Takahiro Tomiyasu, Tokyo (JP); Eisaku Kaji, Tokyo (JP); Yutaka Ohki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 804 days.

(21) Appl. No.: 17/951,291

(22) Filed: Sep. 23, 2022

(65) Prior Publication Data

US 2023/0020128 A1 Jan. 19, 2023

Related U.S. Application Data

(63) Continuation of application No. PCT/JP2020/047769, filed on Dec. 21, 2020.

(30) Foreign Application Priority Data

Mar. 30, 2020 (JP) ................................. 2020-061331

(51) Int. Cl.
   | | |
   |---|---|
   | *H01S 5/023* | (2021.01) |
   | *H01S 5/02315* | (2021.01) |
   | *H01S 5/02345* | (2021.01) |
   | *H01S 5/02355* | (2021.01) |

(52) U.S. Cl.
   CPC .......... *H01S 5/023* (2021.01); *H01S 5/02315* (2021.01); *H01S 5/02345* (2021.01); *H01S 5/02355* (2021.01)

(58) Field of Classification Search
   CPC .. H01S 5/023; H01S 5/02315; H01S 5/02345; H01S 5/0235; H01S 5/02355
   See application file for complete search history.

(56) References Cited

U.S. PATENT DOCUMENTS 5,621,837 A 4/1997 Yamada et al.
2002/0181526 A1* 12/2002 Gao ..................... H01S 5/02375
372/45.01

(Continued)

FOREIGN PATENT DOCUMENTS

JP 08-078657 A 3/1996
JP 2007-013002 A 1/2007

(Continued)

OTHER PUBLICATIONS

Extended European Search Report issued Apr. 29, 2024 in European Patent Application No. 20929035.2, 11 pages.

(Continued)

*Primary Examiner* — James A Menefee
(74) *Attorney, Agent, or Firm* — Oblon, McClelland, Maier & Neustadt, L.L.P.

(57) ABSTRACT

A submount includes a light emitting device mounted thereon. The submount includes: a base including a first surface extending in a first direction and in a second direction that is orthogonal to the first direction; a first electrode extending in the first direction and in the second direction on the first surface, the first electrode including a first end in the second direction, and a second end in opposite direction of the second direction, the second end extending in the first direction; and a second electrode extending in the first direction and in the second direction on the first surface, the second electrode including a third end in the opposite direction of the second direction, the third end being separated from the first end in the second direction with a gap therebetween, and a fourth end in the second direction, the fourth end extending in the first direction. In the second electrode, a second width between the third end and the fourth end in the second direction differs according to a position in the first direction.

10 Claims, 7 Drawing Sheets

(56)                References Cited

U.S. PATENT DOCUMENTS

| | | | |
|---|---|---|---|
| 2003/0052380 A1* | 3/2003 | Yeo ..................... | H01S 5/02345 |
| | | | 257/536 |
| 2012/0230361 A1 | 9/2012 | Adachi et al. | |
| 2015/0372208 A1 | 12/2015 | Chae et al. | |
| 2018/0123695 A1 | 5/2018 | Kubota et al. | |
| 2019/0044301 A1 | 2/2019 | Adachi | |
| 2019/0260179 A1* | 8/2019 | Ueyama .............. | H01S 5/02345 |
| 2020/0271888 A1* | 8/2020 | Croglio, Jr. ............... | G01J 3/10 |
| 2020/0366060 A1 | 11/2020 | Minato et al. | |
| 2020/0395732 A1* | 12/2020 | Heinemann .......... | H01S 5/0234 |
| 2021/0211198 A1* | 7/2021 | Lin ........................ | H01S 5/0264 |
| 2022/0224071 A1* | 7/2022 | Kosaka ................. | H01S 5/0237 |

FOREIGN PATENT DOCUMENTS

| | | | |
|---|---|---|---|
| JP | | 5075165 B2 | 11/2012 |
| JP | | 2016-181542 A | 10/2016 |
| JP | | 2019-029649 A | 2/2019 |
| WO | WO 2011/065517 A1 | | 6/2011 |
| WO | WO 2011/160039 A1 | | 12/2011 |
| WO | WO 2016/170921 A1 | | 10/2016 |
| WO | WO 2019/160039 A1 | | 8/2019 |

OTHER PUBLICATIONS

Ishige, Y., et al., "120w, NA_0.15 fiber coupled LD module with 125- [mu] m clad /NA0.22 fiber by spatial coupling method", Proceedings of SPIE; vol. 10514, Feb. 19, 2018, XP060100158, pp. 105140M-1-105140M-6.

Office Action issued Sep. 19, 2023, in Japanese Patent Application No. 2020-061331, with unedited computer-generated English translation, 7 pages.

International Search Report issued Mar. 16, 2021 in PCT/JP2020/047769 filed on Dec. 21, 2020, 3 pages.

* cited by examiner

SUBMOUNT, LIGHT EMITTING DEVICE, AND OPTICAL MODULE

This application is a continuation of International Application No. PCT/JP2020/047769, filed on Dec. 21, 2020 which claims the benefit of priority of the prior Japanese Patent Application No. 2020-061331, filed on Mar. 30, 2020, the entire contents of which are incorporated herein by reference.

BACKGROUND

The present disclosure relates to a submount, a light emitting device, and an optical module.

A semiconductor laser module is known that functions as an optical module, and includes semiconductor laser chips functioning as light emitting devices and includes an optical fiber that is optically coupled with the semiconductor laser chips. In the case of manufacturing such a semiconductor laser module, the assembly is performed in, for example, the following sequence. Firstly, the semiconductor laser chips are mounted on submounts. At that time, the semiconductor laser chips are joined to the submounts using a solder such as gold tin (AuSn) (see Japanese Patent No. 5075165). Instead of using a solder, it is also possible to use some other adhesive agent such as an electrically conductive adhesive. A submount having a semiconductor laser chip mounted thereon (i.e., a semiconductor-laser-chip-mounted submount) represents an example of a light emitting device, and is also called a chip-on-submount.

Subsequently, using a solder such as a tin bismuth alloy, the chips-on-submounts are joined to a metallic housing either directly or via a metallic base or an electron cooling element. Moreover, other optical components such as lenses are mounted in the housing, and optical coupling of the semiconductor laser chips and an optical fiber is carried out.

As far a semiconductor laser chip is concerned, a semiconductor laser chip of the end face emission type is often used in practice. In a semiconductor laser chip of the end face emission type, one of the two end faces in the longitudinal direction is treated as a rear end face on which HR (high reflection) coating having high reflectance at the lasing wavelength is formed. The other end face is treated as an outgoing end face on which AR (anti-reflection) coating having low reflectance is formed. The rear end face and the outgoing end face constitute a laser resonator, and the oscillated laser light is output mainly from the outgoing end face.

SUMMARY

Generally, a semiconductor laser chip is mounted on a submount using die bonding. In die bonding, the semiconductor laser chip is vacuum chucked using a collet, and is then mounted on a submount that is heated to a temperature equal to or higher than the melting point of a joining material such as a solder.

Then, with the aim of supplying a driving current to the semiconductor laser chips, in order to secure an electrical contact with the semiconductor laser chips, wiring is formed using die bonding between the semiconductor laser chips and the electrodes on the submount. Meanwhile, when semiconductor-laser-chip-mounted submounts are arranged in parallel, wiring among the submounts is sometimes formed using bonding wires.

On the other hand, in recent years, with the downsizing of the semiconductor laser chips and the submounts, it has become difficult to secure a region on the electrodes of a semiconductor laser chip or on the electrodes of a submount for the purpose of joining the wiring using bonding wires.

Moreover, the semiconductor laser chips are increasingly being configured to perform high optical output. Accompanying that, it is becoming increasingly important to effectively release the heat generated by the semiconductor laser chips toward the submounts.

There is a need for a submount, a light emitting device, and an optical module in which, for example, wiring may be joined onto the electrodes with more ease and the required level of heat dissipation may be achieved with ease.

According to one aspect of the present disclosure, there is provided a submount for being mounted with a light emitting device, the submount including: a base including a first surface extending in a first direction and in a second direction that is orthogonal to the first direction; a first electrode extending in the first direction and in the second direction on the first surface, the first electrode including a first end in the second direction, and a second end in opposite direction of the second direction, the second end extending in the first direction; and a second electrode extending in the first direction and in the second direction on the first surface, the second electrode including a third end in the opposite direction of the second direction, the third end being separated from the first end in the second direction with a gap therebetween, and a fourth end in the second direction, the fourth end extending in the first direction, wherein in the second electrode, a second width between the third end and the fourth end in the second direction differs according to a position in the first direction.

DETAILED DESCRIPTION

Figure 1:
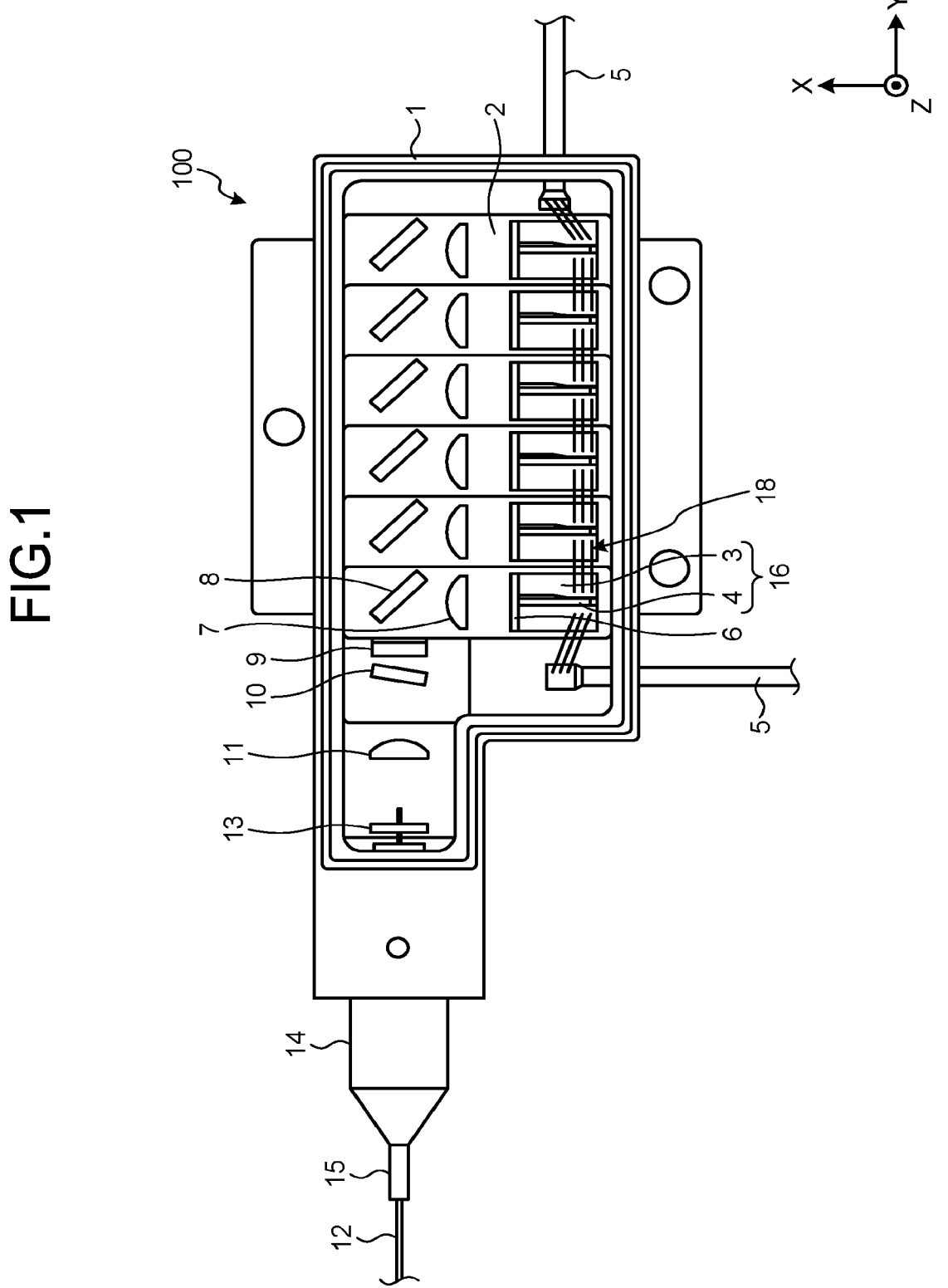
FIG. 1 is an exemplary and schematic planar view of an optical module according to a first embodiment.

Exemplary embodiments of the present disclosure are described below. The configurations according to the embodiments described below, as well as the actions and the results (effects) attributed to the configurations are only exemplary. The present disclosure may also be implemented using a configuration different than the configurations according to the embodiments described below. Moreover, according to the present disclosure, it is possible to achieve at least one of a variety of effects (including secondary effects) attributed to the configurations.

The embodiments described below include identical configurations. Hence, due to the identical configurations according to the embodiments, identical actions and identical effects are obtained. Moreover, in the following explanation, the same configurations have the same reference numerals assigned thereto, and their explanation is not given repeatedly.

In the drawings, the X direction is indicated by an arrow X, the Y direction is indicated by an arrow Y, and the Z direction is indicated by an arrow Z. The X, Y, and Z directions intersect with each other as well as are orthogonal to each other. The X direction represents the outgoing direction of the laser light from a light emitting element and an optical device, as well as represents the longitudinal direction of the light emitting element (the longitudinal element of a resonator). The Y direction represents the width direction of the light emitting element. The Z direction represents the thickness direction (the height direction) of the submount.

Figure 2:
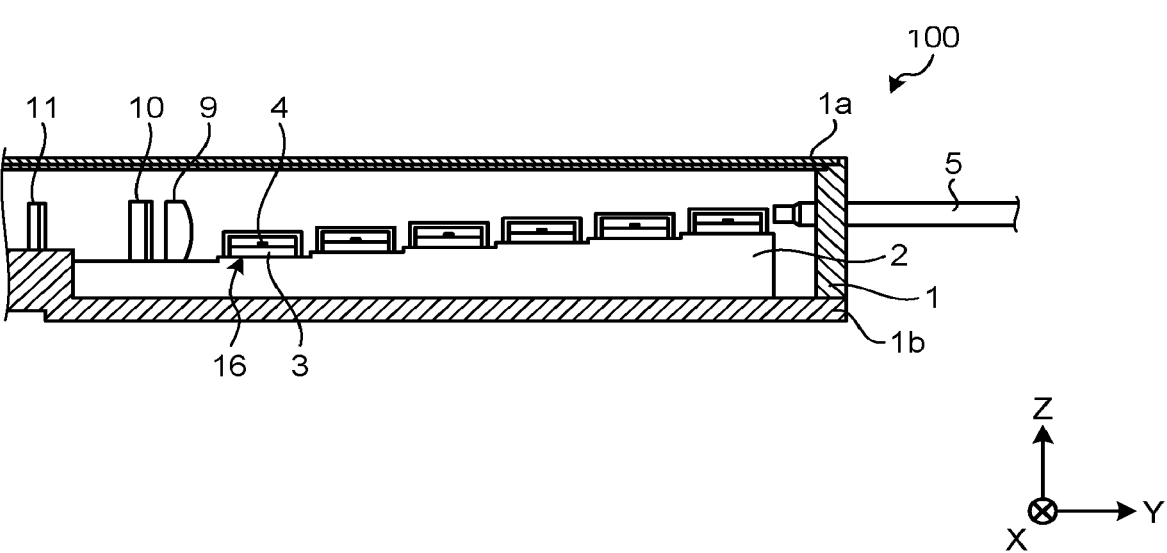
FIG. 2 is an exemplary and schematic side view (partial cross-sectional view) of the optical module according to the first embodiment.

FIG. 1 is a planar view of a semiconductor laser module 100. FIG. 2 is side view (partial cross-sectional view) of the semiconductor laser module 100. The semiconductor laser module 100 represents an example of an optical module.

The semiconductor laser module 100 includes a housing 1 having a lid 1*a* (see FIG. 2) and a case 1*b*. The housing 1 may be made from, for example, a metallic material. In FIG. 1, for explanatory convenience, the lid 1*a* is not illustrated. In other words, FIG. 1 is a planar view of the internal configuration of the semiconductor laser module 100 after the lid 1*a* has been removed.

The semiconductor laser module 100 includes a stepped module base 2, a plurality of submounts 3, and a plurality of semiconductor laser chips 4. The module base 2 is made from a metallic material such as copper having high heat conductivity. The semiconductor laser chips 4 represent an example of light emitting elements. Meanwhile, a subassembly that includes a single submount 3 and a single semiconductor laser chip 4 and that is mounted on the module base 2 represents a single chip-on-submount 16. The chips-on-submounts 16 represent an example of light emitting devices.

The semiconductor laser module 100 includes two lead pins 5. The two lead pins 5 are electrically connected to the semiconductor laser chips 4 via the submounts 3, bonding wires 18, and bonding wires 17 (see FIG. 3); and supply electrical power to the semiconductor laser chips 4. The semiconductor laser module 100 also includes six firstlenses 6, six secondlenses 7, six mirrors 8, a thirdlens 9, an optical filter 10, and a fourthlens 11. The firstlenses 6, the secondlenses 7, the mirrors 8, the thirdlens 9, the optical filter 10, and the fourthlens 11 are arranged in that order on and along the light path of the laser lights emitted by the semiconductor laser chips 4. The semiconductor laser module 100 further includes an optical fiber 12 that is disposed opposite to the fourthlens 11. The end of the optical fiber 12 on which the laser light falls is housed inside the housing 1, and is supported by a supporting member 13. The bonding wires 17 and 18 may also be called wirings or conductors.

Each semiconductor laser chip 4 is configured using, for example, gallium arsenide (GaAs) or indium phosphide (InP) as the chief material; and outputs the laser light having the wavelength corresponding to the material or the composition. Each semiconductor laser chip 4 has the thickness of, for example, 0.1 mm. As illustrated in FIG. 2, each semiconductor laser chip 4 is mounted on the corresponding submount 3; and the submounts 3 are so mounted on the module base 2 their heights are mutually different. The firstlenses 6, the secondlenses 7, and the mirrors 8 are disposed at a corresponding height to the corresponding semiconductor laser chips 4. A subassembly that includes a single submount 3, a single semiconductor laser chip 4 on which the submount 3 is mounted, and the bonding wires 17 (see FIG. 3) represents a single chip-on-submount 16 functioning as a semiconductor-laser-chip-mounted submount.

In the insertion portion from which the optical fiber 12 is inserted into the housing 1, a loose tube 15 is disposed; and a boot 14 is fit onto some part on the housing 1 for covering some part of the loose tube 15 and the insertion portion.

Given below is the explanation of the operations performed in the semiconductor laser module 100. Each semiconductor laser chip 4 operates by the electrical power supplied via the lead pins 5, and outputs a laser light. The laser light output from each semiconductor laser chip 4 is substantially collimated by the corresponding firstlens 6 and the corresponding secondlens 7, and the collimated light is reflected by the corresponding mirror 8 toward the thirdlens 9. Then, the laser lights are collected by the thirdlens 9 and the fourthlens 11, and the collected light falls on the end face of the optical fiber 12 and propagates through the optical fiber 12. The optical filter 10 is a bandpass filter. When a light having a different wavelength than the wavelength of the abovementioned laser light gets input from the outside to the semiconductor laser module 100 via the optical fiber 12, the optical filter 10 prevents that light from entering the semiconductor laser chip 4.

The assembly of the semiconductor laser module 100 is performed in, for example, the following sequence. Firstly, the submounts 3 are heated to about 300° C. representing a junction temperature; the semiconductor laser chips 4 are joined to the submounts 3 using the AuSn solder having the melting point at about 280° C.; and six chips-on-submounts 16 are formed. Subsequently, the case 1*b* of the housing 1, on which the module base 2 is mounted, is heated to about 150° C. representing a junction temperature, and the chips-on-submounts 16 are joined to the module base 2 using the SnBi solder having the melting point at about 140° C. Then, the other components of the semiconductor laser module 100 are attached to the housing 1.

Figure 3:
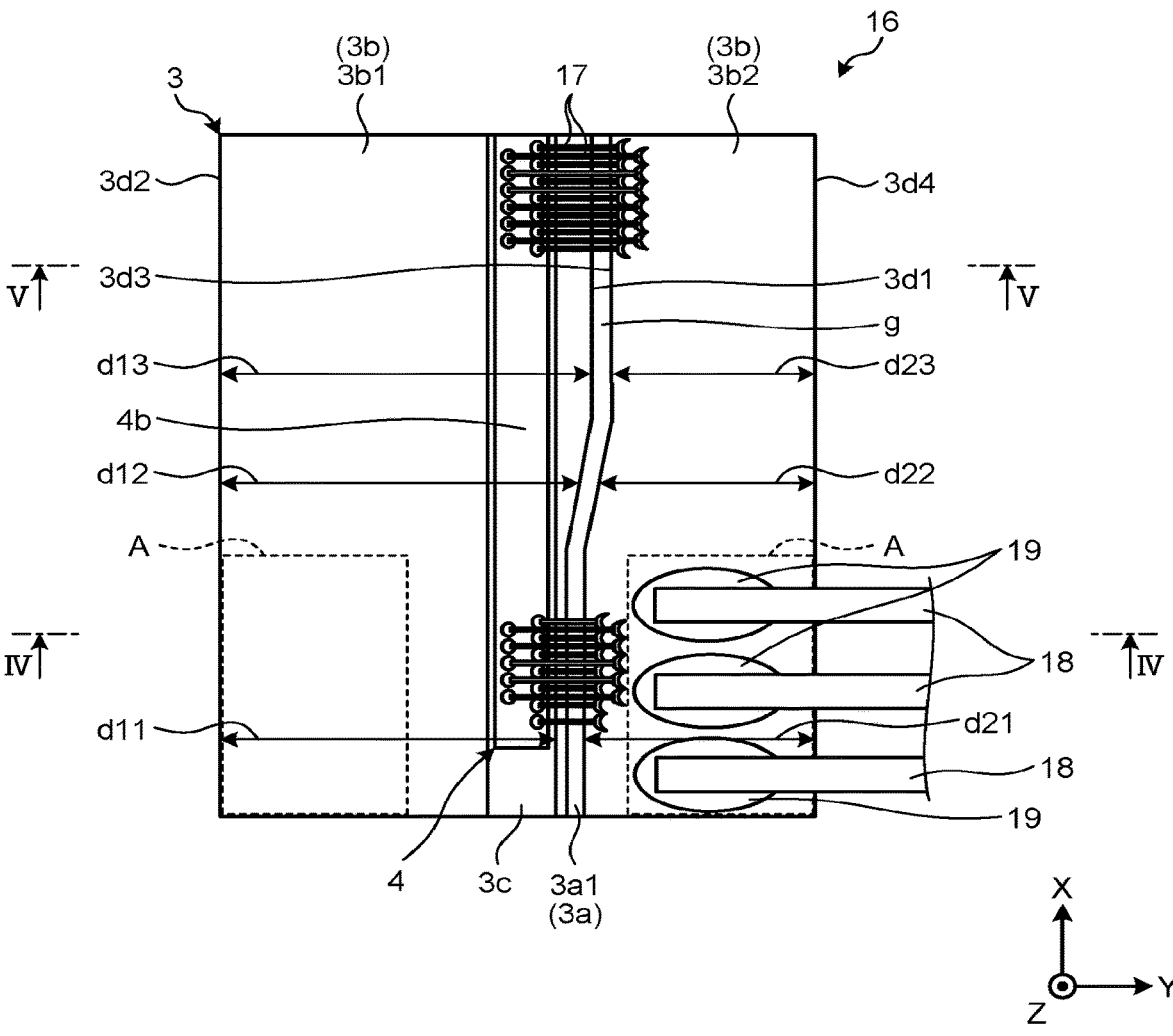
FIG. 3 is an exemplary and schematic planar view of an optical device according to the first embodiment.
Figure 4:
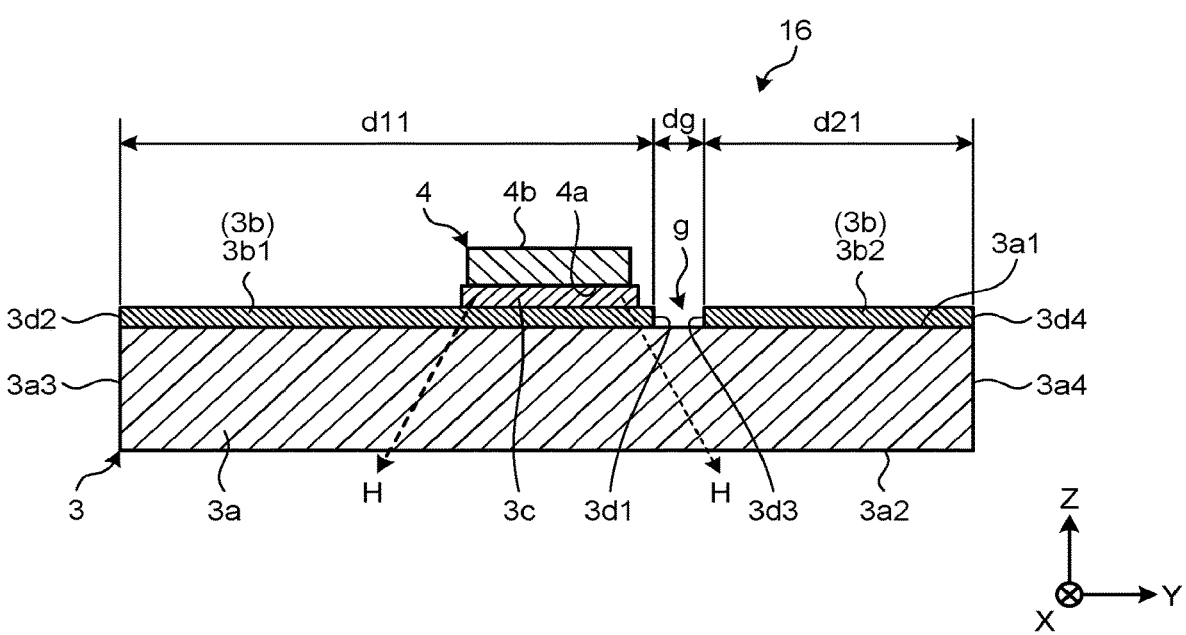
FIG. 4 is an IV-IV cross-sectional view of FIG. 3.
Figure 5:
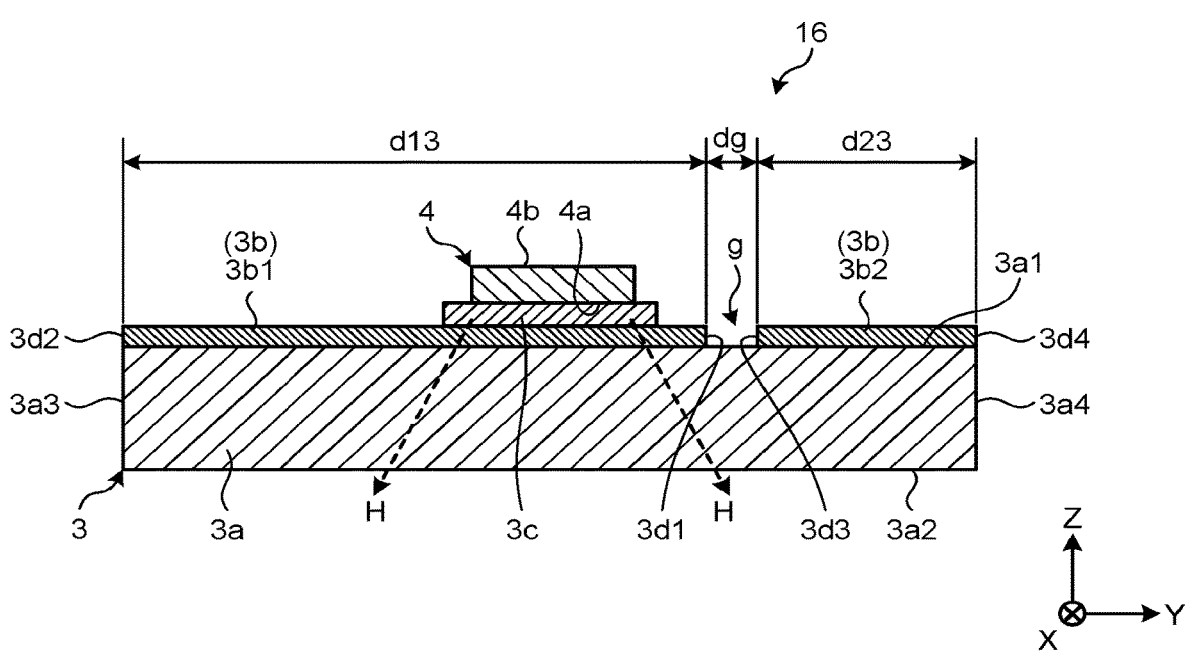
FIG. 5 is a V-V cross-sectional view of FIG. 3.

FIG. 3 is a planar view of the chip-on-submount 16. FIG. 4 is an IV-IV cross-sectional view of FIG. 3. FIG. 5 is a V-V cross-sectional view of FIG. 3. As explained earlier, the chip-on-submount 16 includes the semiconductor laser chip 4, the submount 3 on which the semiconductor laser chip 4 is mounted, and the bonding wires 17.

As illustrated in FIGS. 3 and 4, the submount 3 includes a substrate 3*a* and an upper portion covering layer 3*b*. The substrate 3*a* may contain, for example, at least one of the following: aluminum nitride (AlN), alumina (Al2O3), beryllia (BeO), boron nitride (BN), diamond, silicon carbide (SiC), silicon nitride (Si3N4), silicon dioxide ($SiO_2$), and zirconia (ZrO2). In the first embodiment, the semiconductor laser chip 4 is of the single emitter type. Alternatively, the semiconductor laser chip 4 may be a multi-emitter-type laser bar chip. When the semiconductor laser chip 4 is a laser bar chip, the substrate 3*a* may made from a metal such as Cu. In the first embodiment, the substrate 3*a* is assumed to be made from AlN. Moreover, the substrate 3*a* has the thickness, for example, in the range of 0.3 mm to 1.0 mm. The substrate 3*a* represents an example of a base.

As is clear from FIGS. 3 and 4, the substrate 3*a* has a relatively thin and flattened cuboid shape in the Z direction. In other words, the substrate 3*a* is quadrangular and plate-like in shape.

As illustrated in FIG. 4, the substrate 3*a* includes an outer surface 3*al*, a rear surface 3*a*2, and lateral surfaces 3*a*3 and 3*a*4. At the end portion in the Z direction, the outer surface 3*al* intersects with and is orthogonal to the Z direction, and spreads out in the X and Y directions. At the end portion in the opposite direction of the Z direction, the rear surface 3a2 intersects with and is orthogonal to the Z direction, and spreads out in the X and Y directions. The outer surface 3al and the rear surface 3a2 are parallel to each other. At the end portion in the opposite direction of the Y direction, the lateral surface 3a3 intersects with and is orthogonal to the Y direction, and spreads out in the X and Z directions. At the end portion in the Y direction, the lateral surface 3a4 intersects with and is orthogonal to the Y direction, and spreads out in the X and Z directions. The outer surface 3a1 represents an example of a first surface.

The upper portion covering layer 3b illustrated in FIGS. 3 and 4 is formed on the outer surface 3al of the substrate 3a, that is, on the outer surface 3al of the side on which the semiconductor laser chip 4 is mounted. For example, the upper portion covering layer 3b is a metallic multi-layer film. The upper portion covering layer 3b has the thickness, for example, equal to or greater than 1 μm and equal to or smaller than 80 μm.

The upper portion covering layer 3b is separated into a first electrode 3b1 and a second electrode 3b2 by a gap g. Thus, the gap g electrically insulates the first electrode 3b1 and the second electrode 3b2 from each other. In the planar view illustrated in FIG. 3, that is, when viewed in the opposite direction of the Z direction; because of the gap g, the outer surface 3al of the substrate 3a gets exposed in the space between the first electrode 3b1 and the second electrode 3b2.

The first electrode 3b1 is electrically connected to the second electrode 3b2 of another chip-on-submount 16, such as the neighboring chip-on-submount 16 present in the opposite direction of the Y direction, via the bonding wires 18 (see FIG. 1, not illustrated in FIG. 3). The second electrode 3b2 is electrically connected to the first electrode 3b1 of a different chip-on-submount 16, such as the neighboring chip-on-submount 16 in the Y direction, via the bonding wires 18. Moreover, the second electrode 3b2 is electrically connected to an outer surface 4b of the semiconductor laser chip 4 via the bonding wires 17.

For explanatory convenience, in FIG. 3, only some of the bonding wires 17 are illustrated. Moreover, in FIG. 4, the bonding wires 17 are not illustrated. A plurality of bonding wires 17 is arranged in the X direction at regular intervals in the X direction. The bonding wires 17 connect, electrically and in parallel, the second electrode 3b2 and the outer surface 4b of the semiconductor laser chip 4. As illustrated in FIG. 3, the bonding wires 17 include relatively longer bonding wires 17 and relatively shorter bonding wires 17 arranged alternately in the X direction. Meanwhile, in FIG. 3, in the middle portion in the X direction, the bonding wires 17 are not illustrated. The semiconductor laser chip 4 is joined onto the first electrode 3bl via precoating 3c. For example, the precoating 3c is an AuSn solder that electrically connects the first electrode 3b1 and a rear surface 4a of the semiconductor laser chip 4 to each other. In the upper portion covering layer 3b, a barrier metal layer (not illustrated) made from, for example, platinum (Pt) may be formed on the outer surface that comes in contact with the precoating 3c. Because of the barrier metal layer, it becomes possible to prevent a chemical reaction between the AuSn solder of the precoating 3c and the metallic material of the upper portion covering layer 3b present under the barrier metal layer.

On the rear surface 4a and the outer surface 4b of the semiconductor laser chip 4, electrodes are formed. Via those electrodes, electrical power gets supplied from the lead pins 5 to the semiconductor laser chip 4. Meanwhile, when the semiconductor laser chip 4 is mounted according to the junction down mounting, generally an n-type lateral electrode is formed on the outer surface 4b. On the other hand, when the semiconductor laser chip 4 is mounted according to the junction up mounting, generally a p-type lateral electrode is formed on the outer surface 4b. Meanwhile, if the semiconductor laser chip 4 is mounted according to the junction down mounting, it becomes possible to achieve a higher level of heat dissipation to the submount 3.

As illustrated in FIG. 3, in the first embodiment, the first electrode 3b1 has different widths d11, d12, and d13 in the Y direction according to the position in the X direction. Similarly, the second electrode 3b2 also has different widths d21, d22, and d23 in the Y direction according to the position in the X direction. Accordingly, the gap g happens to be bent. Meanwhile, a width dg of the gap g in the Y direction is constant regardless of the position in the X direction. However, that is not the only possible case. Herein, the widths d11, d12, and d13 represent examples of a first width, and the widths d21, d22, and d23 represent examples of a second width.

The width of the first electrode 3b1 implies the width between a first end 3d1 and a second end 3d2 of the first electrode 3b1. The first end 3d1 represents that end portion of the first electrode 3b1 in the Y direction which faces the gap g. The second end 3d2 represents the end portion of the first electrode 3b1 in the opposite direction of the Y direction, and extends along the X direction. Meanwhile, as illustrated in FIGS. 4 and 5, the second end 3d2 overlaps with the lateral surface 3a3 in the Z direction. However, that is not the only possible case. Alternatively, the second end 3d2 may be positioned away from the lateral surface 3a3 in the Y direction.

The width of the second electrode 3b2 implies the width between a third end 3d3 and a fourth end 3d4 of the second electrode 3b2. The third end 3d3 represents that end portion of the second electrode 3b2 in the opposite direction of the Y direction which faces the gap g as well as faces the first end 3d1 of the first electrode 3b1 from a distance across the gap g. The fourth end 3d4 represents the end portion of the second electrode 3b2 in the Y direction, and extends along the X direction. Meanwhile, as illustrated in FIGS. 4 and 5, the fourth end 3d4 overlaps with the lateral surface 3a4 in the Z direction. However, that is not the only possible case. Alternatively, the fourth end 3d4 may be positioned away from the lateral surface 3a4 in the opposite direction of the Y direction.

In the first embodiment, the width d13 is greater (wider) than the width d11, and the width d23 is smaller (narrower) than the width d21. Moreover, with an increase in the distance in the X direction, the width d12 gradually increases (becomes wider) from the width d11 toward the width d13. Furthermore, with an increase in the distance in the X direction, the width d22 gradually decreases (becomes narrower) from the width d21 toward the width d23.

The bonding wires 18 that are electrically connected to the second electrode 3b2 are mounted in a mounting target region A having the width d21 that is greater than the widths d22 and d23. As illustrated in FIG. 3, the bonding wires 18 are electrically connected to the second electrode 3b2 via solders 19. If the gap g extends straight along the X direction and if the width of the second electrode 3b2 is constant at the relatively-narrower width d23, then the mounting target region A in which the solders 19 may spread out becomes narrower. As a result, due to the interference with the bonding wires 17, it may become difficult to mount the bonding wires 18 and the solders 19 on the second electrode 3b2. In that regard, in the first embodiment, the widths d21, d22, and d23 are kept different according to the position in the X direction; and the mounting target region A, which extends in the X direction at the width d21 that is greater than the widths d22 and d23, may be set to have a relatively larger area. As a result, the bonding wires 18 may be easily joined onto the second electrode 3b2 without interfering with the bonding wires 17. Meanwhile, as explained in the first embodiment, when the width dg of the gap g is either constant along the X direction or does not substantially change along the X direction; accompanying the change in the widths d21, d22, and d23 of the second electrode 3b2 along the X direction, the widths d11, d12, and d13 of the first electrode 3b1 also change in the X direction. Herein, regarding the substrate 3a, the upper portion covering layer 3b, and the submounts 3; the width in the Y direction is substantially constant along the X direction. Hence, greater the width of the first electrode 3b1, the smaller becomes the width of the second electrode 3b2; and, smaller the width of the first electrode 3b1, the greater becomes the width of the second electrode 3b2.

However, since the width d21 of the second electrode 3b2 becomes greater than the widths d22 and d23, at the position at which the bonding wires 18 may be easily mounted, the distance between the semiconductor laser chip 4 and the first end 3d1 in the Y direction is relatively shorter as illustrated in FIG. 4. Hence, a heat quantity H (in FIG. 4, a thin dashed line oriented downward to the right), which is transmitted from the semiconductor laser chip 4 toward the Y direction and the opposite direction of the Z direction via the pre-coating 3c and the first electrode 3b1, becomes smaller than the heat quantity H (in FIG. 4, a thick dashed line oriented downward to the left), which is transmitted from the semi-conductor laser chip 4 toward the opposite direction of the Y direction and the opposite direction of the Z direction via the precoating 3c and the first electrode 3bl. However, in the first embodiment, as explained above, the width of the second electrode 3b2 in the Y direction changes along the X direction; and, at the cross-sectional position illustrated in FIG. 5, the distance between the semiconductor laser chip 4 and the first end 3d1 in the Y direction is relatively longer than the distance at the cross-sectional position illustrated in FIG. 4. Hence, at that position, the heat quantity H (in FIG. 5, a thick dashed line oriented downward to the right), which is transmitted from the semiconductor laser chip 4 toward the Y direction and the opposite direction of the Z direction via the precoating 3c and the first electrode 3b1, becomes greater than the heat quantity H at the cross-sectional position illustrated in FIG. 4. Moreover, that heat quantity H may be kept substantially equivalent to the heat quantity H (in FIG. 5, a thick dashed line oriented downward to the left) that is transmitted from the semiconductor laser chip 4 toward the opposite direction of the Y direction and the opposite direction of the Z direction via the precoating 3c and the first electrode 3b1.

Meanwhile, the mounting target region A for the bonding wires 18 in the first electrode 3b1 (see FIG. 1, not illustrated in FIG. 3) is lined with the mounting target region A in the second electrode 3b2 in the Y direction. However, that is not the only possible case.

As explained above, in the first embodiment, the width of the second electrode 3b2 in the Y direction differs according to the position in the X direction.

With such a configuration, in the second electrode 3b2, in the region having the width d21 that is greater than the widths d22 and d23, the mounting target region A may be set to be relatively wider. Moreover, in the second electrode 3b2, in the regions having the widths d22 and d23 that are greater than the width d21, that is, in the regions of the first electrode 3b1 having a greater width with the widths d11 and d12, the distance between the semiconductor laser chip 4 and the first end 3d1 in the Y direction may be set to be relatively longer. Thus, with such a configuration, it becomes possible to obtain: the submounts 3 in each of which the bonding wires 18 may be easily joined onto the second electrode 3b2 and the required heat dissipation may be easily achieved; the chips-on-submounts 16 that include the submounts 3; and the semiconductor laser module 100 that includes the chips-on-submounts 16.

Moreover, in the first embodiment, the width of the first electrode 3b1 in the Y direction differs according to the position in the X direction.

With such a configuration, in the region of the first electrode 3b1 having a greater width than the widths d11 and d12, it becomes easier to ensure that heat dissipation occurs from the semiconductor laser chip 4.

Figure 6:
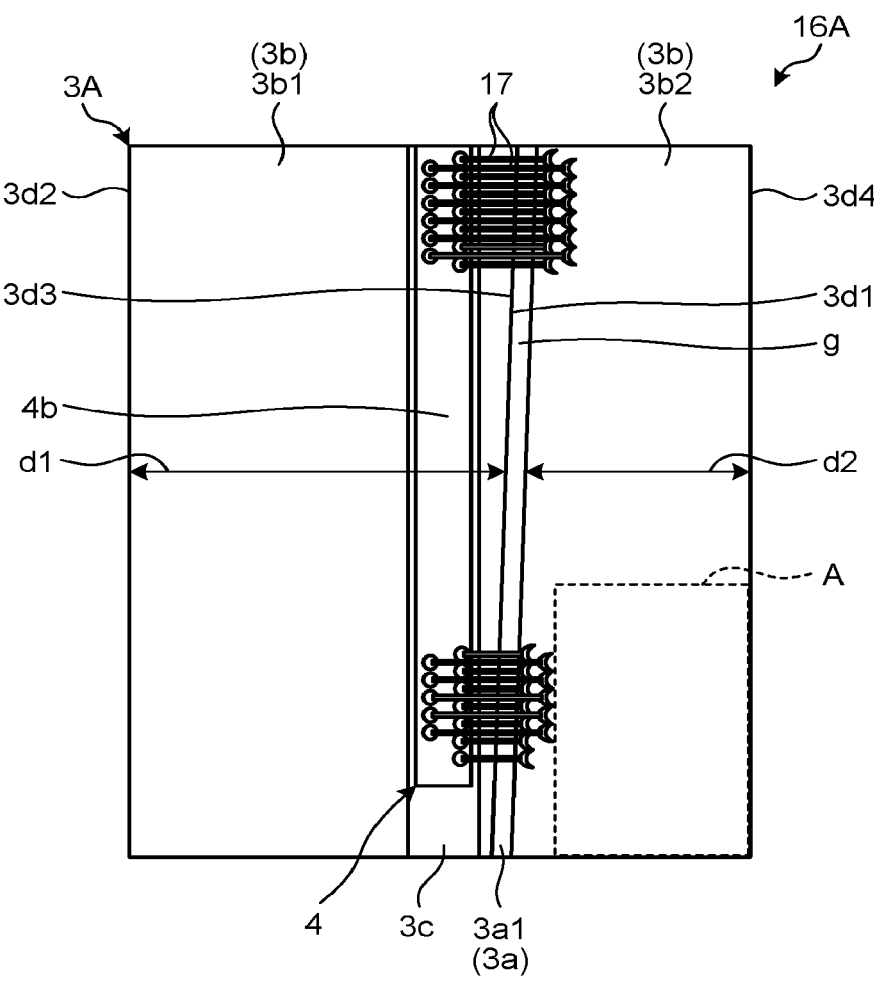
FIG. 6 is an exemplary and schematic planar view of an optical module according to a second embodiment.
Figure 6:
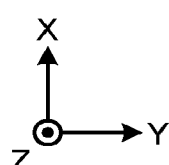

FIG. 6 is a planar view of a chip-on-submount 16A according to a second embodiment. As illustrated in FIG. 6, in the second embodiment, the gap g extends straight at an incline with respect to the X direction. Hence, the width d1 of the first electrode 3b1 gradually becomes greater (wider) with an increase in the distance in the X direction, and the width d2 of the second electrode 3b2 gradually becomes smaller (narrower) with an increase in the distance in the X direction.

In the second embodiment too, in the region of the second electrode 3b2 in which the width d2 is greater than the other widths, it becomes possible to set the mounting target region A to be relatively larger. Moreover, in the region of the first electrode 3b1 in which the width d1 is greater than in the other regions, the distance between the semiconductor laser chip 4 and the first end 3d1 in the Y direction may be set to be relatively longer. Thus, according to the second embodi-ment too, it becomes possible to obtain: submounts 3A in each of which the bonding wires 18 may be easily joined onto the second electrode 3b2 and the required heat dissi-pation may be easily achieved; the chips-on-submounts 16A that include the submounts 3A; and the semiconductor laser module 100 that includes the chips-on-submounts 16A.

Figure 7:
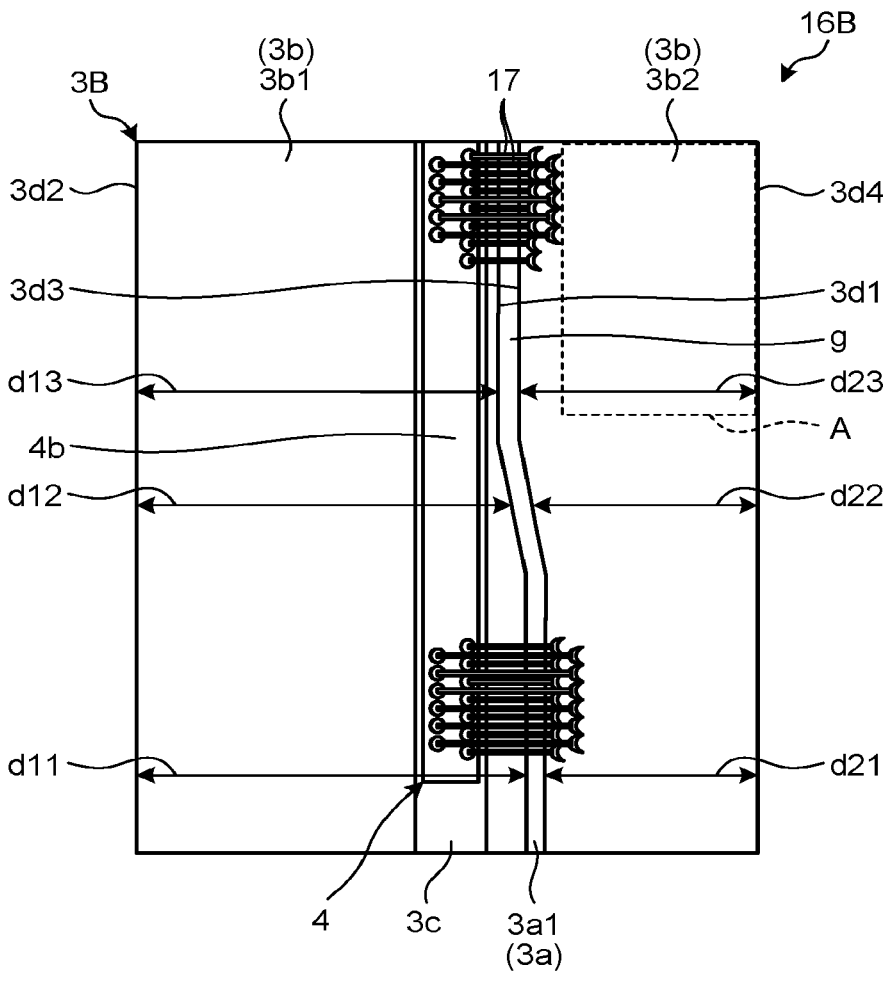
FIG. 7 is an exemplary and schematic planar view of an optical module according to a third embodiment.
Figure 7:
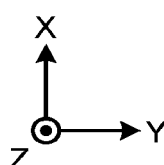

FIG. 7 is a planar view of a chip-on-submount 16B according to a third embodiment. In the first embodiment, as illustrated in FIG. 3, the width d13 of the end portion of the first electrode 3b1 in the X direction (the outgoing direction of the laser light) is greater (wider) than the widths d11 and d12, and the width d23 of the end portion of the second electrode 3b2 in the X direction is smaller (narrower) than the widths d21 and d22. In contrast, in the third embodiment, as illustrated in FIG. 7, the width d13 of the end portion of the first electrode 3b1 in the X direction is smaller (nar-rower) than the widths d11 and d12, and the width d23 of the end portion of the second electrode 3b2 in the X direction is greater (wider) than the widths d21 and d22.

In the third embodiment too, in the region of the second electrode 3b2 having the width d23 that is greater than the widths d21 and d22, it becomes possible to set the mounting target region A to be relatively larger. Moreover, at the positions at which the first electrode 3b1 has the widths d11 and d12 that are greater than the width d13, the distance between the semiconductor laser chip 4 and the first end 3d1 in the Y direction may be set to be relatively longer. Thus, according to the third embodiment too, it becomes possible to obtain: submounts 3B in each of which the bonding wires 18 may be easily joined onto the second electrode 3b2 and the required heat dissipation may be easily achieved; the chips-on-submounts 16B that include the submounts 3B; and the semiconductor laser module 100 that includes the chips-on-submounts 16B.

Figure 8:
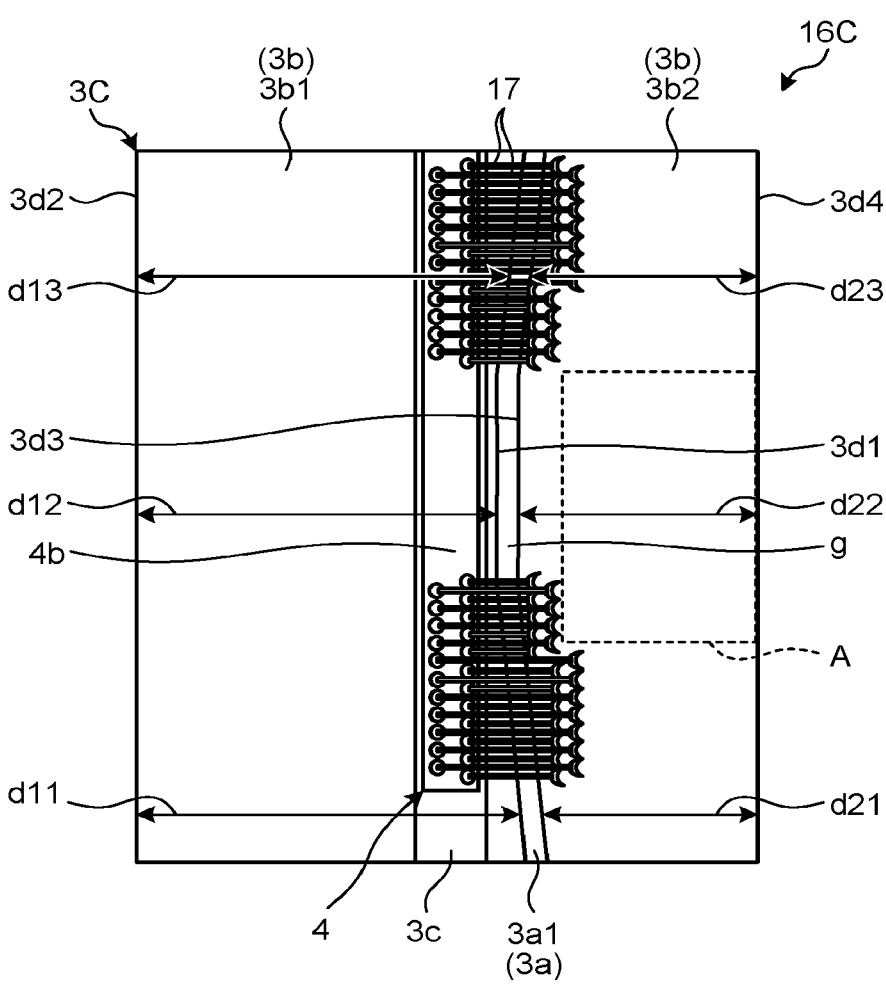
FIG. 8 is an exemplary and schematic planar view of an optical module according to a fourth embodiment.
Figure 8:
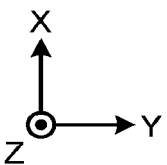

FIG. 8 is a planar view of a chip-on-submount 16C according to a fourth embodiment. In the fourth embodiment, the width d12 of the intermediate portion of the first electrode 3b1 is smaller (narrower) than the widths d1 and d13, and the width d22 of the intermediate portion of the second electrode 3b2 in the X direction is greater (wider) than the widths d21 and d23. Moreover, the width d11 goes on increasing with an increase in the distance in the opposite direction of the X direction, and the width d21 goes on decreasing with an increase in the distance in the opposite direction of the X direction. The widths d12 and d22 are constant regardless of the position in the X direction. The width d13 goes on increasing with an increase in the distance in the X direction, and the width d23 goes on decreasing with an increase in the distance in the X direction.

In the fourth embodiment too, in the region of the second electrode 3b2 having the width d22 that is greater than the widths d21 and d23, it becomes possible to set the mounting target region A to be relatively larger. Moreover, at the position at which the first electrode 3b1 has the width d11 that is greater than the width d12 and at the position at which the first electrode 3b1 has the width d13 that is greater than the width d12, the distance between the semiconductor laser chip 4 and the first end 3d1 in the Y direction may be set to be relatively longer. Thus, according to the fourth embodiment too, it becomes possible to obtain: submounts 3C in each of which the bonding wires 18 may be easily joined onto the second electrode 3b2 and the required heat dissipation may be easily achieved; the chips-on-submounts 16C that include the submounts 3C; and the semiconductor laser module 100 that includes the chips-on-submounts 16C.

While certain embodiments and modification examples have been described, these embodiments and modification examples have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure. Moreover, regarding the constituent elements, the specifications about the configurations and the shapes (structure, type, direction, shape, size, length, width, thickness, height, number, arrangement, position, material, etc.) may be suitably modified.

For example, the submounts and the optical elements according to the present disclosure may be implemented in an optical device or an optical module that is different than the disclosure given in the embodiments.

Moreover, the gap, the first electrode, and the second electrode may be formed in various shapes.

The present disclosure may be used in a submount, an optical device, and an optical module.

According to the present disclosure, it becomes possible to obtain a submount, a light emitting device, and an optical module in which, for example, wiring may be joined onto the electrodes with more ease and the required level of heat dissipation may be achieved with ease.

10

What is claimed is:

1. A light emitting device comprising:
a submount for being mounted with a light emitting device, the submount comprising:
a base including a first surface extending in a first direction and in a second direction that is orthogonal to the first direction;
a first electrode extending in the first direction and in the second direction on the first surface, the first electrode including:
a first end in the second direction, and
a second end in an opposite direction of the second direction, the second end extending in the first direction; and
a second electrode extending in the first direction and in the second direction on the first surface, the second electrode including:
a third end in the opposite direction of the second direction, the third end being separated from the first end in the second direction with a gap therebetween, and
a fourth end in the second direction, the fourth end extending in the first direction, wherein the second electrode has a second width between the third end and the fourth end in the second direction and the second width differs according to a position in the first direction; and
a light emitting element comprising:
a rear surface placed on the first electrode and electrically connected to the first electrode,
an outer surface positioned on an opposite side to the rear surface and which is electrically connected to the second electrode via a conductor, and
a side edge extending in the first direction closer along the first end than the second end of the first electrode, wherein:
at first position in the first direction, the side edge is located a first distance from the first end of the first electrode,
at a second position in the first direction, the side edge is located a second distance from the first end of the first electrode,
the first distance is less than the second distance,
the second electrode is connected to a bonding wire via a solder at the first position,
the second width of the second electrode is wider at the first position than at the second position in the first direction so as to ensure heat dissipation by increasing heat quantity transmitted from the light emitting element via the first electrode at the second position where a width of the first electrode is wide comparing to heat quantity transmitted from the light emitting element via the first electrode at the first position where a width of the first electrode is narrow, and
the light emitting element is mounted on the first electrode as a position closer to the first end of the first electrode than the second end of the first electrode.

2. The light emitting device according to claim 1, wherein, in the first electrode, a first width between the first end and the second end in the second direction differs according to the position in the first direction.

3. The light emitting device according to claim 2, wherein the second width in the first position is equal to or wider than the second width in any other positions along the first direction.

4. The light emitting device according to claim 1, wherein the light emitting device is a semiconductor laser device containing gallium arsenide or indium phosphide.

5. An optical module comprising:

a housing including a module base; and at least one light emitting device provided on the module base and configured to function as the light emitting device according to claim 1.

6. The optical module according to claim 5, wherein the light emitting device includes a plurality of light emitting devices arranged in the second direction.

7. The light emitting device according to claim 1, wherein the second width of the second electrode between the third end and the fourth end in the second direction or a first width between the first end and the second end in the second direction differs according to the position in the first direction where the second electrode or the first electrode and the light emitting device are arranged side by side.

8. An optical module comprising:

a housing including a module base; and at least one light emitting device provided on the module base and configured to function as the light emitting device according to claim 7.

9. The optical module according to claim 8, wherein the light emitting device includes a plurality of light emitting devices arranged in the second direction.

10. The light emitting device according to claim 1, wherein the second width in the first position is equal to or wider than the second width in any other positions along the first direction.

\* \* \* \* \*